United States Patent [19]
Beltramini

[11] Patent Number: 4,894,557
[45] Date of Patent: Jan. 16, 1990

[54] ASYNCRONOUS EDGE-TRIGGERED RS FLIP-FLOP CIRCUIT

[75] Inventor: Angelo Beltramini, Galliate, Italy

[73] Assignee: Montedison S.p.A., Milan, Italy

[21] Appl. No.: 191,363

[22] Filed: May 9, 1988

[30] Foreign Application Priority Data

May 15, 1987 [IT] Italy .................. 20536 A/87

[51] Int. Cl.⁴ .......................................... H03K 3/037
[52] U.S. Cl. ...................................... 307/291; 307/443
[58] Field of Search ................... 307/289, 241, 443

[56] References Cited
U.S. PATENT DOCUMENTS
4,607,173  8/1986  Knoedl, Jr. .................. 307/291

Primary Examiner—John Zazworsky
Attorney, Agent, or Firm—Stevens, Davis, Miller & Mosher

[57] ABSTRACT

An edge triggered RS-type flip-flop circuit is disclosed which is capable of changing its state in response to a significant signal transition applied to a currently active input (SET or RESET) and independently of the current state of the other input (RESET or SET). The device can have one or more SET and RESET inputs, as well as Clear and Preset auxiliary inputs, and for the latter inputs the flip-flop circuit will behave as an ordinary RS flip-flop.

13 Claims, 8 Drawing Sheets

| Q(t) | S(t) | R(t) | Q(t+n) | Note |
|---|---|---|---|---|
| 0 | 0→1 | 0 | Q' : 1→0<br>Q : 0→1 | |
| 1<br>1<br>1 | 1→0<br>0→1<br>0 | 0<br>0<br>0 | 1<br>1<br>1 | 1<br>3 |
| 1 | 0 | 0→1 | Q' : 0→1<br>Q : 1→0 | |
| 0<br>0<br>0 | 0<br>0<br>0 | 1→0<br>0→1<br>0 | 0<br>0<br>0 | 2<br>3 |
| 0 | 0→1 | 1 | Q' : 1→0<br>Q = 0 | 4.1 |
| 1 | 1 | 0→1 | Q' = 0<br>Q : 1→0 | 4.2 |
| Q = 0<br>Q' = 0 | 1→0 | 1 | Q' : 0→1<br>Q = 0 | 5.1 |
| Q = 0<br>Q' = 0 | 1 | 1→0 | Q : 0→1<br>Q' = 0 | 5.2 |
| Q = 0<br>Q' = 0 | 1→0 | 1→0 | Q : 0--)?<br>Q' : 0--)? | 6 |

| Q(t) | S(t) | R(t) | Q(t+nt) |
|------|------|------|---------|
| 0    | 0->1 | x    | 0->1    |
| 1    | 0->1 | x    | 1       |
| 0    | x    | 0->1 | 0       |
| 1    | x    | 0->1 | 1->0    |

ASYNCRONOUS EDGE-TRIGGERED RS FLIP-FLOP CIRCUIT

BACKGROUND OF THE INVENTION

1. Field of the Invention

The present invention is directed to an asynchronous edge triggered RS flip-flop circuit for use in creating asynchronous digital circuits of the so-called "self-clocking" and "self-timing" type.

2. Brief Discussion of the Art

In order to better understand the flip-flop circuit that is the subject of the present invention, reference is first made to FIGS. 1 to 5 representing a conventional RS flip-flop, commonly employed as an "elementary" circuit, which is used to form sequential digital networks. It is commonly constructed in a solid state form, i.e., as an "integrated circuit", and when duly associated with other circuits permits great flexibility in design application.

A conventional RS flip-flop circuit requires a particular control command for switching, as explained below and has at least one output Q and two inputs: S (set) and R (reset), respectively, for "setting" and "resetting" the output state of the device.

Figure 1:
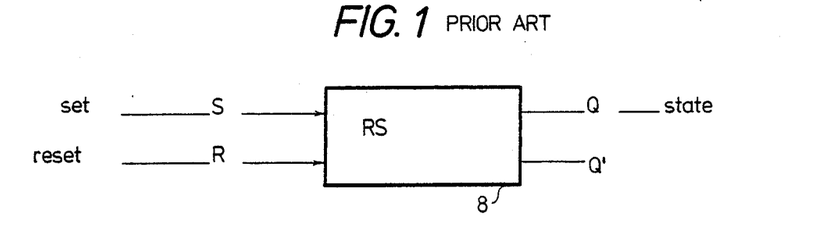
FIG. 1 is a block diagram of a conventional RS flip-flop.

FIG. 1 shows the block diagram of a conventional RS flip-flop 8. The RS flip-flop 8 is said to be "set" when output Q assumes the "true" value (Q=1, in positive logic). The output symbol will be represented with Q(1), thus also denoting the symbol of the operation logic type (1, according to positive logic). Conversely, the RS flip-flop 8 is said to be "reset" when the same Q output assumes the "false" value (Q=0, in positive logic). Conventional RS flip-flops also have another possible output Q' (0), representing, except for a slight time difference, the complement (negative logic) of output Q.

A significant transition in signal level applied to the active input S (set) (0→1, in positive logic) will set the device, whereas a corresponding significant transition at the input R (reset) (0 →1, in positive logic) will reset it.

In the ensuing description the input symbols will be expressed with S(1) and R(1), i.e., assigning to the letters the logical level achieved after the significant transition. Consequently the Set input is enabled and the Reset input is disabled when the flip-flop is reset Q(1) =0, while the Reset input is enabled and the Set input is disabled when the flip-flop is set Q(1)=1. The significant transition which has to be applied to the active set and reset inputs in order to change the device state will be represented in both cases by the variation (0→1) of that input.

The input signal transitions (1→0) applied to the set and reset inputs will have no effect on the state assumed by the flip-flop. Obviously it is impossible to set a flip-flop that has already been set as well as to reset an already reset one. In addition, the correct performance of the set and reset control commands will occur only on condition that the significant transition applied to the input currently enabled (e.g., set) occurs when the other input (e.g., reset) is disabled.

Figure 2:
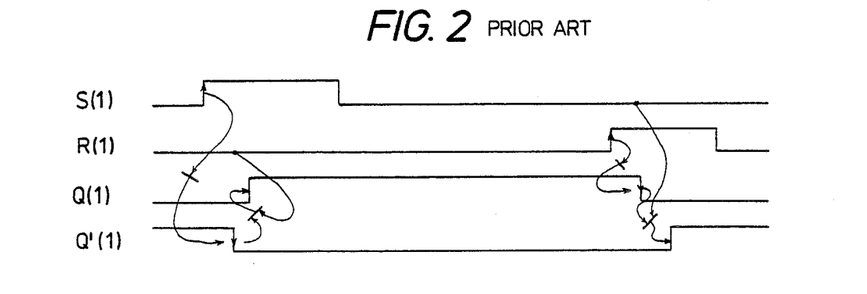
FIG. 2 is a timing diagram of the conventional RS flip-flop.
Figure 3:
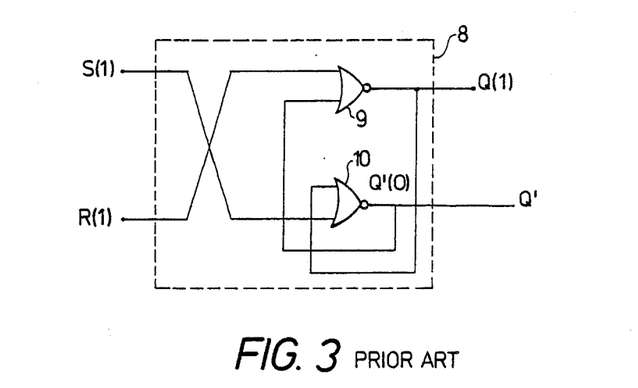
FIG. 3 is a typical logical scheme of the conventional RS flip-flop.

FIG. 2 shows the timing diagram of the conventional RS flip-flop 8 operation, while FIG. 3 shows a typical RS flip-flop logical circuit employing a pair of cross-coupled NOR gates 9 and 10. As will be described below, cross-coupled NAND gates can also be used to form an RS flip-flop.

The FIG. 2 timing diagram shows that when the set input (S(1)) goes high (positive), it causes the Q' signal to go low (negative). When this happens, and the reset input (R(1)) remains low, (that is, disabled) the Q(1) output signal goes high (positive) placing the flip-flop 8 in a set condition. FIG. 2 also shows that when the reset input (R(1)) goes high (positive), it causes the Q(1) output to go low (negative). When this occurs and the set input remains low (that is, disabled), the Q' signal goes high (positive) placing flip-flop 8 in a reset state.

For completeness sake and in order to better clarify the comparisons that are about to be made, the logical equation of the RS flip-flop 8 is given hereunder:

$$Q = \overline{R} \wedge (S \vee Q),$$

where "$\wedge$" represents the logical AND operator and "$\vee$" the logical OR operator.

Figure 4:
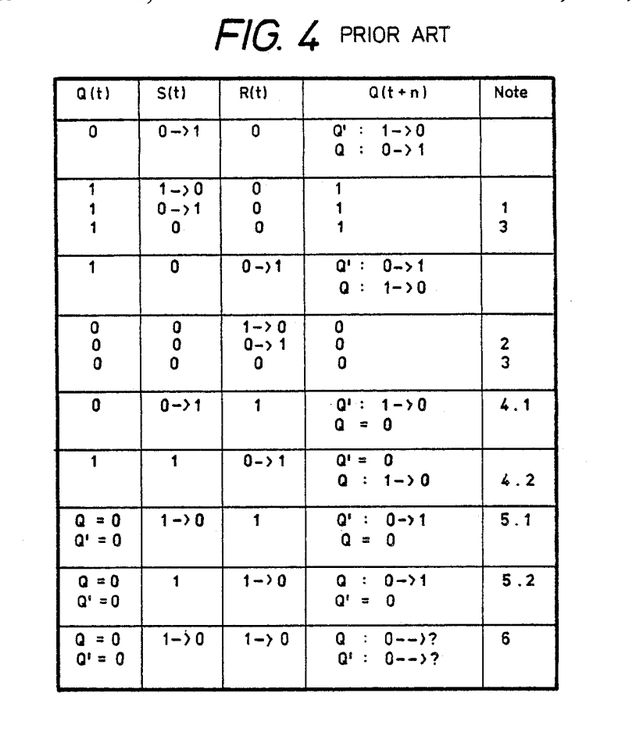
FIG. 4 is a logical table of states and transitions for the conventional RS flip-flop.
Figure 5:
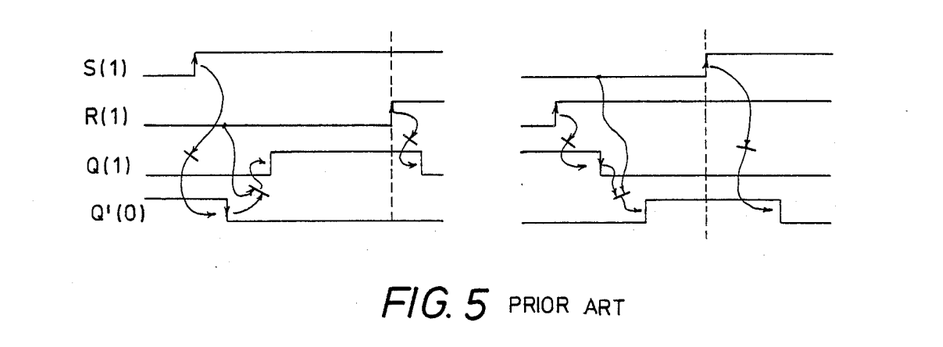
FIG. 5 is a timing diagram of a conventional RS flip-flop showing anomalous behavior.

FIG. 4 is a Boolean operation table illustrating transitions and states of the RS flip-flop 8. Whenever the procedure of enabling one input while disabling the other is disregarded, i.e., active input signal transitions (e.g., 0→1) are applied to both inputs, the result is an anomalous behavior (see FIG. 4, notes 4.1 and 4.2). The flip-flop 8 assumes the state (Q=0, Q'=0), and consequently it is neither set nor reset, as shown by the timing diagram in FIG. 5. In this case the offset mode of the set and reset commands will determine the next state of the flip-flop (see FIG. 4, notes 5.1 and 5.2).

In addition whenever, starting with the "non-set" and "non-reset" condition (Q=0, Q'=0), one applies at the same time to both set and reset inputs the transition (1→0), this will result in a lack of determination of state assumed by the flip-flop (see FIG. 4, note 6).

As a conclusion, it can be observed that the ordinary RS flip-flop responds to the significant transitions applied to the set and reset inputs (0→1, in positive logic), but the state assumed will still depend on the signals applied to the set and reset inputs even after the time which is needed for the new state realization to occur has elapsed. Hence it is necessary that one input must be disabled before applying a significant transition to the other. Following a similar analysis to the above, the same problem exists for an RS flip-flop operating with negative logic both for inputs and outputs.

SUMMARY OF THE INVENTION

In view of the foregoing, one object of the present invention is the provision of an edge-triggered RS flip-flop which changes it state in response to a significant input signal edge on one of the set and reset inputs and independently of the state of a signal on the other input.

This resolves the problem of the output ambiguities discussed since the device that is the object of the present invention is edge-triggerable only. The edge triggered RS flip-flop of the invention is particularly suitable for use in circuits of the "self-clocking" and "self-timing" type.

BRIEF DESCRIPTION OF THE DRAWINGS

The above and other objects, features and advantages of the invention will be more clearly understood from the following detailed description of the invention which is provided in connection with the accompanying drawings in which.

DETAILED DESCRIPTION OF THE INVENTION

Figure 6:
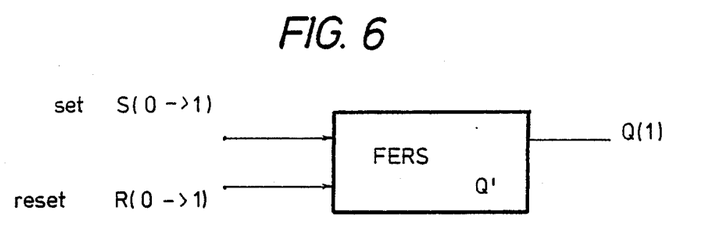
FIG. 6 is a block diagram of an RS flip-flop constructed in accordance with the invention.
Figure 7:
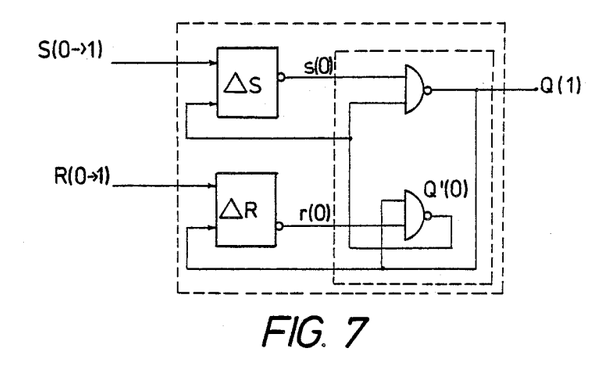
FIG. 7 is a logical scheme of an RS flip-flop constructed in accordance with the invention.

Various embodiments of the RS flip-flop of the invention are described below in connection with FIGS. 6 through 18. A block diagram representation of a flip-flop 11 constructed in accordance with the invention and operating on positive edge transitions (0→1) at the set and reset inputs is shown in FIG. 6, while FIG. 7 shows the internal construction of flip-flop 11. It should be noted that although the invention is described with positive edge transitions (0→1), the invention also pertains to devices that respond to negative edge transitions (1→0).

As shown in FIG. 7, the flip-flop 11 of the invention, hereinafter also called a FERS circuit, includes an ordinary RS flip-flop 13 formed of cross-coupled NAND gates 25 and 27, the output Q(1) of which form the output of flip-flop 11. Two logical devices 12 and 14, called $\Delta S$ and $\Delta R$ DERIVERRS, are connected respectively on the ordinary command inputs s(O) and r(O) (now expressed in negative logic) of flip-flop 13. The function of the $\Delta S$ and $\Delta R$ DERIVERS is that of sending to the set and reset inputs of the output flip-flop 13 the appropriate set or reset signal, in negative logic, for a duration that is strictly needed to ensure a change in state after which the output of the activated DERIVER returns to its rest state. An exemplary construction of DERIVERS $\Delta S$ and $\Delta R$ is described below in connection with FIGS. 10, 13 and 16 and is also described in detail in U.S. application Ser. No. 165,908, filed Mar. 9, 1988, and entitled "Differentiating Logical Circuit For Asynchronous Systems," the disclosure of which is incorporated herein by reference.

A particular characteristic of a DERIVER circuit is that a derivative output signal Y thereof changes states (e.g. 0→1 for positive logic), upon a change of state (e.g. 0→1) of an input signal X, but the output signal Y only reverts to its original state (e.g. 1→0, for positive logic) in response to a transition in a feedback signal F (e.g., 0→1) from a subsequent circuit. In this way, a DERIVER circuit only supplies an output signal Y for the duration of time it is needed to affect (switch) a downstream digital circuit, as the transition in the feedback signal F, received from the downstream circuit, indicates the occurrence of the switching of the downstream circuit and is used by the DERIVER to return its output to the rest state.

In application Ser. No. 165,908, three types of DERIVER circuits are described. The first type generates the output signal Y in full independence of the state of the feedback signal F, while the second and the third types only generate the output signal Y when the feedback signal F is in a predetermined state, e.g., at rest, but, in any event, all three types of DERIVER circuits share the characteristic that the active transition of the feedback signal F is needed to return the output signal Y to a rest state (e.g., 1→0).

Various types of DERIVER logical circuits, such as AND, OR, etc. are also described in detail in the above-referenced U.S. application. For the purposes of the present application, exemplary $\Delta S$, $\Delta R$ DERIVER circuits 12 and 14 which can be used to construct the RS flip-flop 11 of the invention are depicted in detail in FIGS. 10, 13 and 16.

Figure 8:
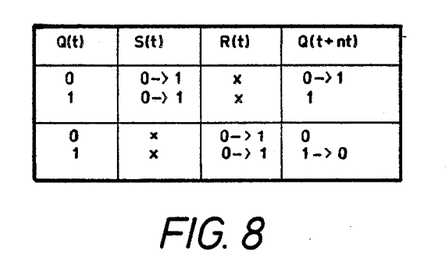
FIG. 8 is a table of states and transitions of the FIG. 7 RS flip-flop.
Figure 9:
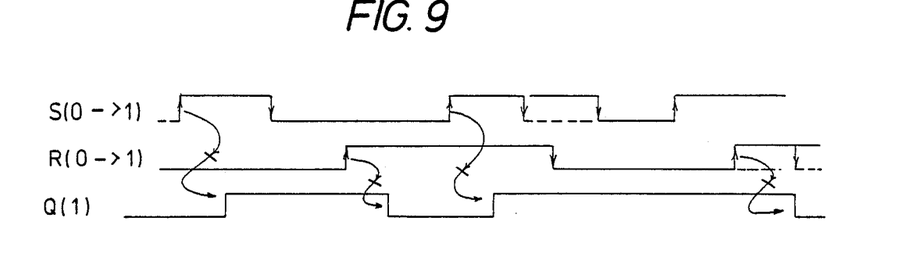
FIG. 9 is a timing diagram of the FIG. 7 RS flip-flop.

FIG. 8 represents the Boolean operation table for the FIG. 7 flip-flop and FIG. 9 represents the general timing diagram of the device operation. FIG. 9 particularly shows how the switching edges of one input, e.g., set input (S (0→1) cause a change in output Q(1) of the signal level independent of the other, e.g., reset, input. The edges of signals s(1→0) and r(1→0) as inputs to flip-flop 13 will occur in response to the occurrence of the relevant input edges of input signals S(0→1) and R(0→1) on the condition that the input edges have the possibility of respectively setting or resetting the device. The signals s(1→0) and r(1→0) do not occur where the enabling edges S(0→1) or R(0→1) merely reconfirms the current state of the RS flip-flop 13.

The circuit in FIG. 7 has one constraint connected with the feedback behavior due to the current state of the output flip-flop. DERIVERS described as type 2 and 3 in the above-mentioned U.S. Pat. application can be properly used for the realization of an RS flip-flop in accordance with the present invention. DERIVER type 1 has not been considered for the realization of the RS flip-flop of the present invention since this particular type of deriver depends on the transition but not from the level. It could be used, but from the practical point of view has less interest since it is more complicated.

Figure 10:
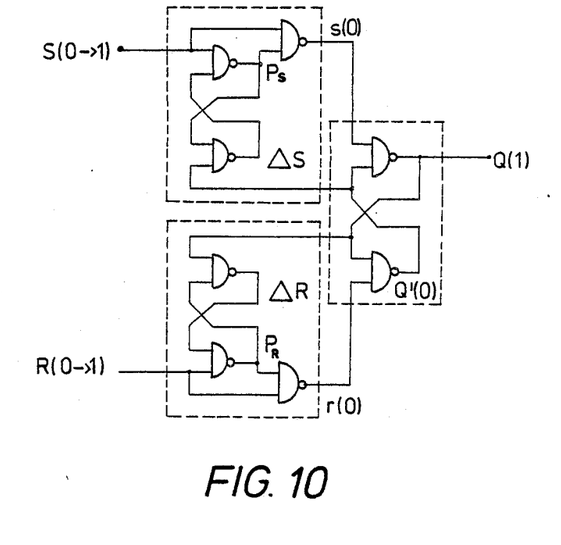
FIG. 10 is a circuit diagram of a first embodiment of an RS flip-flop constructed in accordance with the invention.
Figure 11:
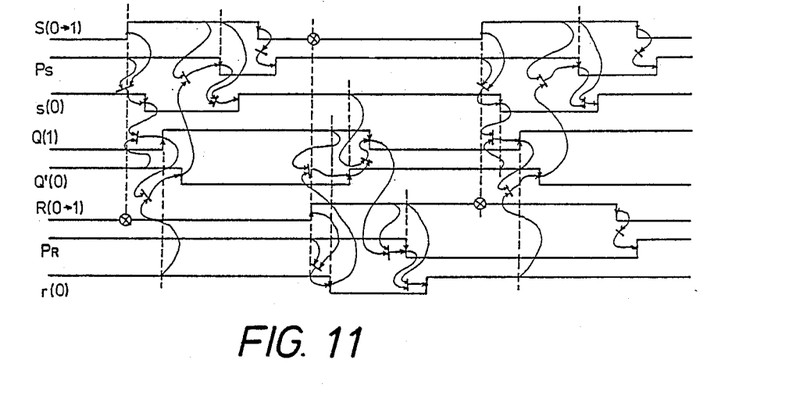
FIG. 11 is a timing diagram for the FIG. 10 circuit.

A first embodiment of the present invention, realized using a type 2 DERIVER, is shown in FIG. 10, while FIG. 11 illustrates the timing diagram of the FIG. 10 flip-flop operation.

The logical equation of the FIG. 10 circuit is:

$$Q = (S \wedge P_s) \vee (Q \wedge (\overline{R \wedge P_r})).$$

where $P_s$ and $P_r$ are respectively signals developed inside the DERIVERS 12 and 14, as shown in FIG. 10.

As shown in FIG. 10, the ΔS and ΔR DERIVERS 12, 14 have an identical construction. Accordingly, only the ΔS DERIVER 12 will be described in detail. The DERIVER 12 is constructed with an output gate supplying an output signal Ya as the set signal s(o). Because a negative signal transition (1→0) is desired for a positive input signal S(0→1) transition, the output gate is a NAND gate 16. The DERIVER further includes two cross-coupled NAND gates 18 and 20. An applied input signal S(0→1) is coupled to one input of NAND gate 18 and one input of NAND gate 16. An output signal $P_s$ from NAND gate 18 is coupled to another input of NAND gate 16 and to one input of NAND gate 20. The output of NAND gate 20 is coupled to another input of NAND gate 18. A feedback signal Fa from a downstream circuit, here Q'(o) of flip-flop 13, is supplied to another input of NAND gate 20. As discussed above, the output Ya of the DERIVER 12 will change from its rest state to another state (here 1→0) when a transition occurs on the input line Xa (here 0→1) and that changed output state will be maintained until a transition (here 1→0) occurs in the feedback signal Fa. The other DERIVER circuit 14 has an identical construction as circuit 12, but for clarification, the output signal, input signal and feedback signal are respectively denoted Yb, Xb and Fb.

Figure 12:
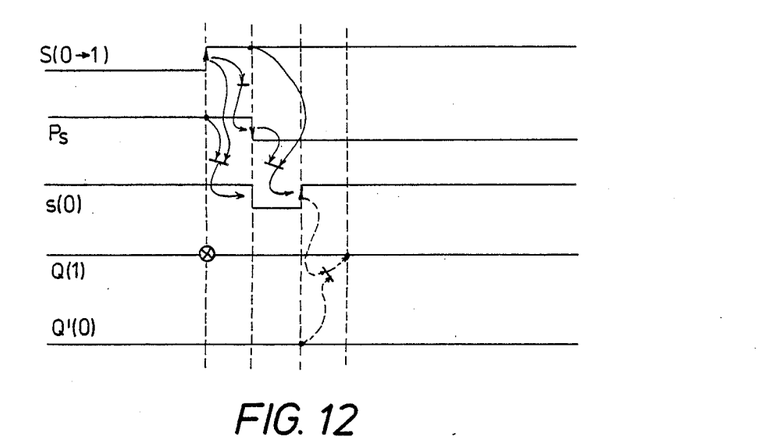
FIG. 12 is a timing diagram for setting the FIG. 10 circuit when it has been previously set.

When using a type 2 DERIVER, setting an already set flip-flop 13 or resetting an already reset one leads to generating, respectively in s(O) and r(O), a static hazard. However, this induces no anomalous behavior, as shown by the timing diagram in FIG. 12 and particularly by the last dotted line logic sequence.

Figure 13:
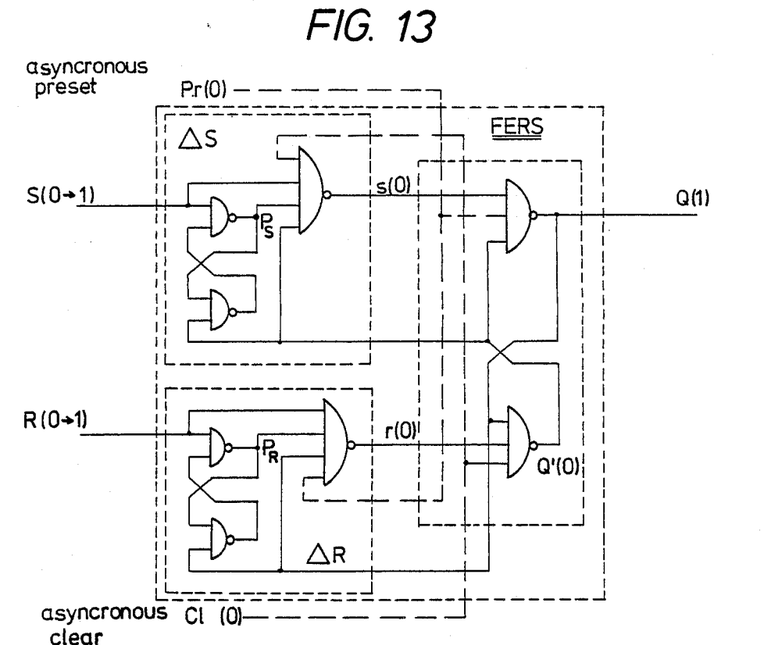
FIG. 13 is a logical circuit diagram of a second embodiment of an RS flip-flop constructed in accordance with the invention.

The circuit representation of an RS flip-flop in accordance with this invention and using a type 3 DERIVER for the ΔS and ΔR circuits is shown in FIG. 13. In FIG. 13 ΔS and ΔR DERIVERS are denoted by 12' and 14', respectively. In a type 3 DERIVER an additional input to the DERIVER output NAND gate 21 is connected to receive and is affected by the associated feedback signal Fa or Fb.

Using the type 3 DERIVER (circuits 12' and 14') will exclude operation of the DERIVER that is not performing any switching of flip-flop 13, hence only the DERIVER (ΔS or ΔR) that is capable of enabling a flip-flop 13 state change will be active.

Figure 14:
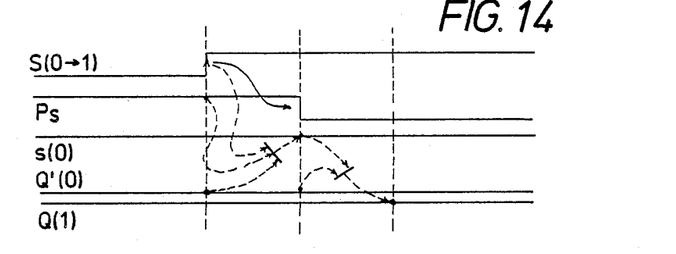
FIG. 14 is a timing diagram for the FIG. 13 circuit.

FIG. 14 shows the timing diagram of the action tending to set flip-flop 13 that has already been set in the FIG. 13 circuit. FIG. 14 shows a lack of the static hazard which occurred when a type 2 DERIVER was used.

In the case of simultaneous application of the significant edge to the two inputs, i.e., S (0→1) and R (0→1), the FIG. 13 device will have no possibility other than being Set if it was Reset, or vice versa, thus assuming a "toggle" type behavior that is typical of a JK flip-flop. Actually, no difference exists between an "asynchronous RS flip-flop" and an "asynchronous JK flip-flop", except for the fact that the latter is capable of performing also the "toggle" function.

Figure 15:
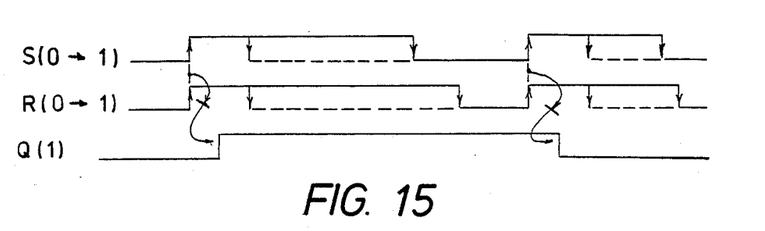
FIG. 15 is a timing diagram for the FIG. 13 circuit in a "toggle" configuration.
Figure 16:
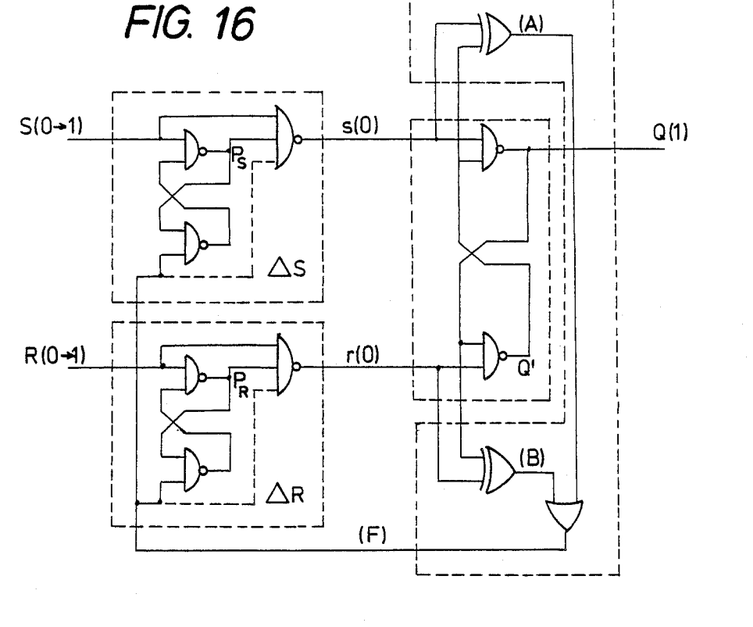
FIG. 16 is a logical circuit diagram of a third embodiment of an RS flip-flop constructed in accordance with the invention.

FIG. 15 shows the general timing diagram of the FIG. 13 circuit flip-flop toggle operation in a case where the significant edge (0→1) is simultaneously applied to both the S(0→1) and R(0→1) inputs. The typical equation of the device has not changed. If the "toggle" type behavior is not desired, the flip-flop circuit can be modified utilizing one feedback only in common, as shown in FIG. 16. In this embodiment the contemporary application of the significant edge (0→1) to set and reset inputs s(o) and r(o) cannot occur, as in the case of using a type 2 DERIVER.

In this case the transition (1→0) of feedback F results from the logical ORing in OR circuit 23 of the outputs of XOR gates 19 and 24 which have inputs respectively coupled to the inputs of NAND gates 25 and 27 of flip-flop 13. The feedback signal F confirms a state transition of the output flip-flop 13 which transition will disable the DERIVER which caused a changed state in the output flip-flop 13.

Figure 17:
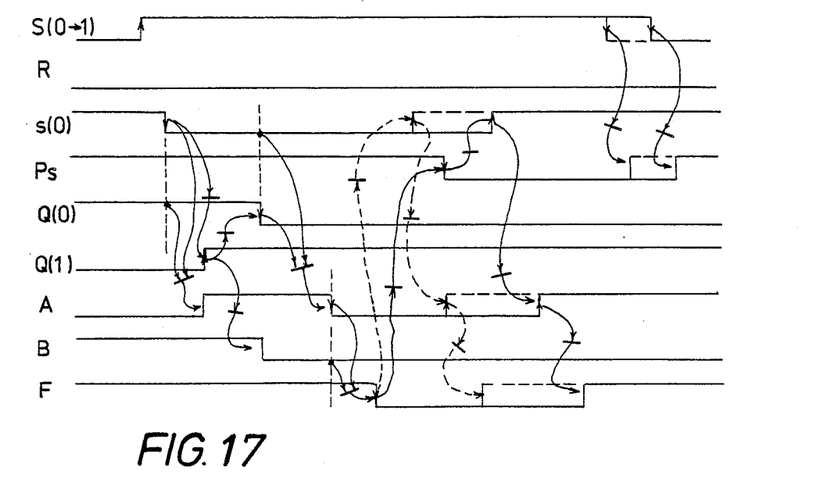
FIG. 17 is a timing diagram for the FIG. 16 circuit.
Figure 18:
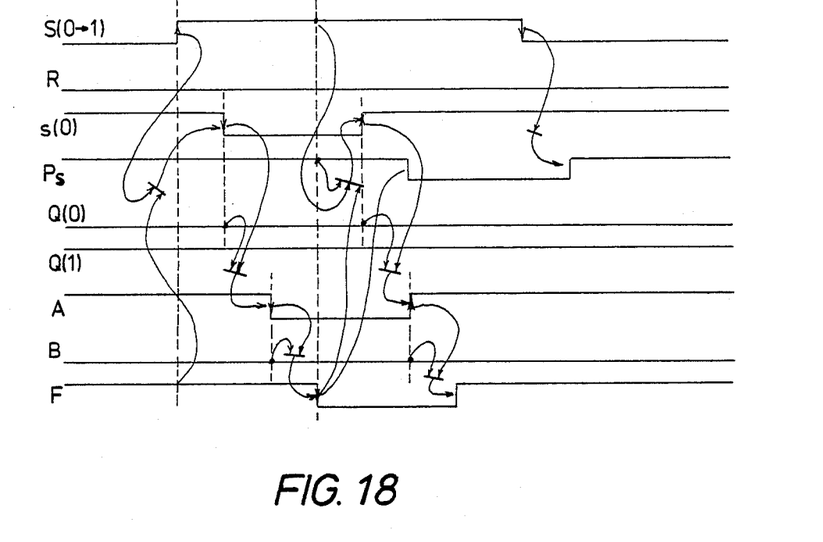
FIG. 18 is a timing diagram for setting the FIG. 16 circuit when it has been previously set.

FIG. 17 shows the timing diagram of this device when setting a reset flip-flop. Whenever a setting action occurs on an already set flip-flop, the feedback signal will be generated anyway, announcing a non-existent output transition. In this case a static hazard will be generated in S(O), producing no variation of the flip-flop 13 state, as shown in FIG. 18.

With the FIG. 16 circuit only one feedback signal F is obtained having the following logical equation:

$$F=((R \wedge P_r \wedge F) \wedge \overline{Q} \wedge (S \overline{\wedge} P_s \overline{\wedge} F)) \overline{V} ((R \overline{\wedge} P_r \overline{\wedge} F) \cdot Q \wedge (S \wedge P_s \wedge F))$$

which will disable the DERIVER that had caused the output flip-flop commutation.

The typical output logical equation for the FIG. 16 device is:

$$Q = (S \wedge P_s \wedge F) V (Q \wedge (R \overline{\wedge} P_r \overline{\wedge} F))$$

where F represents the common feedback.

The reply delay, ensuring commutation (F(0→1), is reduced when connecting feedback F to the input NAND gate 21 of the DERIVERS, since the s(0→1) or r(0→1) state change is no longer realized through $P_s$ and $P_r$, but straight from F.

This connection is illustrated by broken lines in FIG. 16, and the related timing sequence is illustrated by broken lines in FIG. 17.

For any of the cases described above, the RS flip-flop of the present invention can be realized in such a way as to respond also to switching edges (1→0). The above applies also to outputs that were represented in positive logic. It is also possible to utilize DERIVERS which use different logics in the same flip-flop. An RS flip-flop can be realized also with more inputs, both Set and Reset, which can also use different logics for each input. Moreover, the flip-flop circuit of the present invention can have auxiliary clear and preset inputs, i.e., as illustrated in FIG. 13 and when these auxiliary inputs are used the circuit will behave as an ordinary RS flip-flop.

As another alternative, it is also possible to construct an RS flip-flop using only one DERIVER circuit on either the set s(o) or reset r(o) inputs to flip-flop 13. If a DERIVER is used on the set s(o) input only, then a CLEAR circuit, as illustrated in FIG. 13, which has a CLEAR input signal applied to NAND gate 21 of the ΔS DERIVER and to an input of NAND gate 27 of flip-flop 13, should also be included. If a DERIVER is used only on the reset r(o) input of flip-flop 13, then the PRESET circuit, illustrated in FIG. 13, which has a PRESET input signal applied to NAND gate 21 of the ΔR DERIVER and to an input of NAND gate 25 of flip-flop 13 should also be included.

The RS flip-flop circuit of the present invention has been herein described in connection with various figures representing exemplary embodiments. Of course, various changes and modifications can be made to the illustrated embodiments without departing from the spirits and scope of the invention. Accordingly, the invention is not limited by the foregoing description, but is only limited by the scope of the appended claims.

What is claimed is:

1. An asyncronous flip-flop comprising:
   an RS flip-flop output circuit having at least one output Q, at least one set (s) input and at least one reset (r) input, said RS flip-flop circuit being formed by a pair of cross-coupled logical gate circuits, each of which has at least a first input receiving an output signal from the other cross-coupled gate circuit and a second input as a respective one of the set (s) and reset (r) inputs;
   a first circuit connected to one of said set (s) and reset (r) inputs and comprising:
   means for accepting at least one input signal Xa;
   means responsive to a change in state of said one input signal Xa for producing a change in state in an output signal Ya from a rest state to another state, said output signal Ya being coupled with one of said set (s) and reset (r) inputs;
   means for accepting at least one feedback signal F representing the output Q of said RS flip-flop,
   means responsive to a change in state of said feedback signal F for returning said output signal Ya to its rest state;
   a second circuit connected to the other of said set (s) and reset (r) inputs and comprising:
   means for accepting at least one input signal Xb;
   means responsive to a change in state of said one input signal Xb for producing a change in state of an output signal Yb from a rest state to another state, said output signal Yb being coupled to the other of said set (s) and reset (r) inputs;
   means for accepting said at least one feedback signal F representing the output Q of said RS flip-flop, and
   means responsive to a change in state of said feedback signal F for returning said output signal Yb to its rest state; and
   means for generating said feedback signal F and comprising:
   a first XOR gate having an output and first and second inputs respectively coupled to the first and second inputs of one of said cross-coupled gates; and
   a second XOR gate having an output and first and second inputs respectively coupled to the first and second inputs of the other of said cross-coupled gates; and,
   an OR gate having first and second inputs respectively coupled to the outputs of said first and second XOR gates, and an output which supplies said feedback signal F in common to said first and second circuits.

2. An asyncronous flip-flop as in claim 1 wherein said cross-coupled gates are cross-coupled NAND gates.

3. An asynchronous flip-flop as in Claim 1, wherein said RS flip-flop changes its state in accordance with a change in state of one of said signals Xa, Xb applied to said first and second circuits, independently of the state of the other of said signals Xa, Xb.

4. An asynchronous flip-flop as in Claim 1, wherein in each of said first and second circuits, a logical transition of the applied signal Xa, Xb in a first logical direction causes a logical transition of the output signal Ya, Yb in a second logical direction, opposite the first.

5. An asynchronous flip-flop as in Claim 4, wherein said first circuit further comprises:
   a first NAND gate having an output which forms said output signal Ya, and at least first and second inputs;
   a second NAND gate having an output $P_s$ connected to one of the inputs of said first NAND gate and at least first and second inputs, said first input of said second NAND gate receiving an applied signal S, the other input of said first NAND gate also receiving said applied signal S; and
   a third NAND gate having an output connected to the second input of said second NAND gate and a first input connected to the output $P_s$ of said second NAND gate and a second input receiving said feedback signal F; and
   said second circuit further comprises:
   a fourth NAND gate having an output which forms said output signal Yb and at least first and second inputs;
   a fifth NAND gate having an output $P_r$ connected to one of the inputs of said fourth NAND gate and at least first and second inputs, said first input of said fifth NAND gate receiving an applied signal R, the other input of said fourth NAND gate also receiving said applied signal R; and
   a sixth NAND gate having an output connected to the second input of said fifth NAND gate and a first input connected to the output $P_r$ of said fifth NAND gate and a second input receiving said feedback signal F.

6. An asychronous flip-flop as in Claim 5, wherein said first NAND gate has a third input connected to receive said feedback signal F and fourth NAND gate has a third input connected to receive said feedback signal F.

7. An asynchronous flip-flop as in Claim 5, wherein when switching signal transitions occur simultaneously in said input signal S and R, said asynchronous flip-flop acts as a toggle flip-flop wherein the output Q of said RS flip-flop changes state.

8. An asynchronous flip-flop as in claim 5, wherein said cross-coupled gates of said RS flip-flop comprise:
   a seventh NAND gate having an output Q, a first input (s) and a second input; and
   an eighth NAND gate having an output Q, a first input (r) and a second input, the second input of said seventh NAND gate receiving the output Q said eighth NAND gate and the second input of said eighth NAND gate receiving the output Q of said seventh NAND gate.

9. An asynchronous flip-flop as in Claim 8, having a logical equation for a common feedback signal F as follows:

$$F = ((R \wedge P_r \wedge F) \wedge \overline{Q} \wedge (S \overline{\wedge} P_s \overline{\wedge} F) \overline{V} ((R \wedge P_r \overline{\wedge} F) - Q \wedge (S \wedge P_s \wedge F)$$

where $\wedge$ represent the logical AND function, $\overline{\wedge}$ represent the logical $\overline{AND}$ function and $\overline{V}$ represent the logical OR function.

10. An asynchronous flip-flop as in Claim 8, which has the logical output Q equation:

$$Q = (S \wedge P_s \wedge F) V (Q' (R \overline{\wedge} P_r \overline{\wedge} F))$$

where ∧ represent the logical AND function, V represents the logical OR function, and $\overline{\wedge}$ represent the logical AND function.

11. An asynchronous flip-flop as in Claim 1, wherein said output Q changes state in response to a positive transition of an applied input signal.

12. An asynchronous flip-flop as in Claim 1, wherein said output Q changes state in response to a negative transition of an applied input signal.

13. An asyncronous flip-flop comprising:
an RS flip-flop output circuit having at least one output Q, at least one set (s) input and at least one reset (r) input, said RS flip-flop circuit being formed by a pair of cross-coupled logical gate circuits, each of which has at least a first input receiving an output signal from the other cross-coupled gate circuit and a second input as a respective one of the set (s) and reset (r) inputs;
a first circuit connected to one of said set (s) and reset (r) inputs and comprising:
means for accepting at least one input signal Xa;
means responsive to a change in state of said one input signal Xa for producing a change in state in an output signal Ya from a rest state to another state, said output signal Ya being coupled with one of said set (s) and reset (r) inputs;
means for accepting at least one feedback signal F representing the output Q of said RS flip-flop,
means responsive to a change in state of said feedback signal F for returning said output signal Ya to its rest state;
a second circuit connected to the other of said set (s) and reset (r) inputs and comprising:
means for accepting at least one input signal Xb;
means responsive to a change in state of said one input signal Xb for producing a change in state of an output signal Yb from a rest state to another state, said output signal Yb being coupled to the other of said set (s) and reset (r) inputs;
means for accepting said at least one feedback signal F representing the output Q of said RS flip-flop, and
means responsive to a change in state of said feedback signal F for returning said output signal Yb to its rest state; and
means connected to the output of said RS flip-flop for generating said feedback signal F and applying it to said first and second circuits.

* * * * *